United States Patent
Hillman

(10) Patent No.: US 7,442,636 B2
(45) Date of Patent: Oct. 28, 2008

(54) METHOD OF INHIBITING COPPER CORROSION DURING SUPERCRITICAL $CO_2$ CLEANING

(75) Inventor: Joseph Hillman, Scottsdale, AZ (US)

(73) Assignee: Tokyo Electron Limited, Minato-Ku, Tokyo ( * ) Notice: Subject to any disclaimer, the term of this patent is extended or adjusted under 35 U.S.C. 154(b) by 416 days.

(21) Appl. No.: 11/095,827

(22) Filed: Mar. 30, 2005

(65) Prior Publication Data
US 2006/0228874 A1    Oct. 12, 2006

(51) Int. Cl.
H01L 21/4763    (2006.01)

(52) U.S. Cl. .................. 438/622; 438/658; 438/687; 438/689; 257/E21.002

(58) Field of Classification Search ............ 438/622, 438/658, 687, 689
See application file for complete search history.

(56) References Cited

U.S. PATENT DOCUMENTS

| | | | |
|---|---|---|---|
| 2,439,689 A | 4/1948 | Hyde et al. | |
| 2,617,719 A | 11/1952 | Stewart | |
| 2,993,449 A | 7/1961 | Harland | 103/87 |
| 3,135,211 A | 6/1964 | Pezzillo | 103/87 |
| 3,642,020 A | 2/1972 | Payne | |
| 3,646,948 A | 3/1972 | Athey | 134/57 D |
| 3,890,176 A | 6/1975 | Bolon | |
| 3,900,551 A | 8/1975 | Bardoncelli et al. | |
| 4,219,333 A | 8/1980 | Harris | |
| 4,341,592 A | 7/1982 | Shortes et al. | |
| 4,349,415 A | 9/1982 | DeFilippi et al. | |
| 4,475,993 A | 10/1984 | Blander et al. | |
| 4,618,769 A | 10/1986 | Johnson et al. | 250/338 |
| 4,730,630 A | 3/1988 | Ranft | 134/111 |
| 4,749,440 A | 6/1988 | Blackwood et al. | |
| 4,838,476 A | 6/1989 | Rahn | |
| 4,877,530 A | 10/1989 | Moses | |
| 4,879,004 A | 11/1989 | Oesch et al. | |
| 4,923,828 A | 5/1990 | Gluck et al. | |
| 4,925,790 A | 5/1990 | Blanch et al. | |
| 4,933,404 A | 6/1990 | Beckman et al. | |
| 4,944,837 A | 7/1990 | Nishikawa et al. | |
| 5,011,542 A | 4/1991 | Weil | |
| 5,013,366 A | 5/1991 | Jackson et al. | |

(Continued)

FOREIGN PATENT DOCUMENTS

DE    39 04 514 C2    8/1990

(Continued)

OTHER PUBLICATIONS

J.B. Rubin et al. "A Comparison of Chilled DI Water/Ozone and Co2-Based Supercritical Fluids as Replacements for Photoresist-Stripping Solvents", IEEE/CPMT Int'l Electronics Manufacturing Technology Symposium, 1998, pp. 308-314.

(Continued)

*Primary Examiner*—Zandra Smith
*Assistant Examiner*—Christy L Novacek
(74) *Attorney, Agent, or Firm*—Haverstock & Owens LLP

(57) ABSTRACT

A method for the pre-treatment of a wafer substrates with exposed metal surfaces is disclosed. The pre-treatment reduces oxidation of the exposed metal surfaces during subsequent supercritical cleaning processes.

33 Claims, 4 Drawing Sheets

U.S. PATENT DOCUMENTS

| | | | |
|---|---|---|---|
| 5,068,040 A | 11/1991 | Jackson | |
| 5,071,485 A | 12/1991 | Matthews et al. | |
| 5,091,207 A | 2/1992 | Tanaka | |
| 5,105,556 A | 4/1992 | Kurokawa et al. | |
| 5,158,704 A | 10/1992 | Fulton et al. | |
| 5,174,917 A | 12/1992 | Monzyk | |
| 5,185,058 A | 2/1993 | Cathey, Jr. | |
| 5,185,296 A | 2/1993 | Morita et al. | |
| 5,196,134 A | 3/1993 | Jackson | |
| 5,197,800 A | 3/1993 | Saidman et al. | 366/136 |
| 5,201,960 A | 4/1993 | Starov | |
| 5,213,619 A | 5/1993 | Jackson et al. | |
| 5,215,592 A | 6/1993 | Jackson | |
| 5,225,173 A | 7/1993 | Wai | |
| 5,236,602 A | 8/1993 | Jackson | |
| 5,237,824 A | 8/1993 | Pawliszyn | |
| 5,238,671 A | 8/1993 | Matson et al. | |
| 5,250,078 A | 10/1993 | Saus et al. | |
| 5,261,965 A | 11/1993 | Moslehi | |
| 5,266,205 A | 11/1993 | Fulton et al. | |
| 5,269,815 A | 12/1993 | Schlenker et al. | |
| 5,269,850 A | 12/1993 | Jackson | |
| 5,274,129 A | 12/1993 | Natale et al. | |
| 5,285,352 A | 2/1994 | Pastore et al. | |
| 5,285,845 A | 2/1994 | Östbo | 165/168 |
| 5,288,333 A | 2/1994 | Tanaka et al. | |
| 5,290,361 A | 3/1994 | Hayashida et al. | |
| 5,294,261 A | 3/1994 | McDermott et al. | |
| 5,298,032 A | 3/1994 | Schlenker et al. | |
| 5,304,515 A | 4/1994 | Morita et al. | |
| 5,306,350 A | 4/1994 | Hoy et al. | |
| 5,312,882 A | 5/1994 | DeSimone et al. | |
| 5,314,574 A | 5/1994 | Takahashi | |
| 5,316,591 A | 5/1994 | Chao et al. | |
| 5,320,742 A | 6/1994 | Fletcher et al. | |
| 5,328,722 A | 7/1994 | Ghanayem et al. | |
| 5,334,332 A | 8/1994 | Lee | |
| 5,334,493 A | 8/1994 | Fujita et al. | |
| 5,352,327 A | 10/1994 | Witowski | |
| 5,356,538 A | 10/1994 | Wai et al. | |
| 5,364,497 A | 11/1994 | Chau et al. | |
| 5,370,740 A | 12/1994 | Chao et al. | |
| 5,370,741 A | 12/1994 | Bergman | |
| 5,370,742 A | 12/1994 | Mitchell et al. | |
| 5,378,311 A | 1/1995 | Nagayama et al. | 156/643 |
| 5,397,220 A | 3/1995 | Akihisa et al. | 417/369 |
| 5,401,322 A | 3/1995 | Marshall | |
| 5,403,621 A | 4/1995 | Jackson et al. | |
| 5,403,665 A | 4/1995 | Alley et al. | |
| 5,417,768 A | 5/1995 | Smith, Jr. et al. | |
| 5,456,759 A | 10/1995 | Stanford, Jr. et al. | |
| 5,470,393 A | 11/1995 | Fukazawa | |
| 5,474,812 A | 12/1995 | Truckenmuller et al. | |
| 5,482,564 A | 1/1996 | Douglas et al. | |
| 5,486,212 A | 1/1996 | Mitchell et al. | |
| 5,494,526 A | 2/1996 | Paranjpe | |
| 5,500,081 A | 3/1996 | Bergman | |
| 5,501,761 A | 3/1996 | Evans et al. | |
| 5,514,220 A | 5/1996 | Wetmore et al. | |
| 5,522,938 A | 6/1996 | O'Brien | |
| 5,547,774 A | 8/1996 | Gimzewski et al. | |
| 5,550,211 A | 8/1996 | DeCrosta et al. | |
| 5,580,846 A | 12/1996 | Hayashida et al. | |
| 5,589,082 A | 12/1996 | Lin et al. | |
| 5,589,105 A | 12/1996 | DeSimone et al. | |
| 5,629,918 A | 5/1997 | Ho et al. | |
| 5,632,847 A | 5/1997 | Ohno et al. | |
| 5,635,463 A | 6/1997 | Muraoka | |
| 5,637,151 A | 6/1997 | Schulz | |
| 5,641,887 A | 6/1997 | Beckman et al. | |
| 5,656,097 A | 8/1997 | Olesen et al. | |
| 5,665,527 A | 9/1997 | Allen et al. | |
| 5,676,705 A | 10/1997 | Jureller et al. | |
| 5,679,169 A | 10/1997 | Gonzales et al. | |
| 5,679,171 A | 10/1997 | Saga et al. | |
| 5,683,473 A | 11/1997 | Jureller et al. | |
| 5,683,977 A | 11/1997 | Jureller et al. | |
| 5,688,617 A | 11/1997 | Mikami et al. | 430/5 |
| 5,688,879 A | 11/1997 | DeSimone | |
| 5,700,379 A | 12/1997 | Biebl | |
| 5,714,299 A | 2/1998 | Combes et al. | |
| 5,725,987 A | 3/1998 | Combes et al. | |
| 5,726,211 A | 3/1998 | Hedrick et al. | |
| 5,730,874 A | 3/1998 | Wai et al. | |
| 5,736,425 A | 4/1998 | Smith et al. | |
| 5,739,223 A | 4/1998 | DeSimone | |
| 5,766,367 A | 6/1998 | Smith et al. | |
| 5,783,082 A | 7/1998 | DeSimone et al. | |
| 5,797,719 A | 8/1998 | James et al. | |
| 5,798,438 A | 8/1998 | Sawan et al. | |
| 5,804,607 A | 9/1998 | Hedrick et al. | |
| 5,807,607 A | 9/1998 | Smith et al. | |
| 5,847,443 A | 12/1998 | Cho et al. | |
| 5,866,005 A | 2/1999 | DeSimone et al. | |
| 5,868,856 A | 2/1999 | Douglas et al. | |
| 5,868,862 A | 2/1999 | Douglas et al. | |
| 5,872,061 A | 2/1999 | Lee et al. | |
| 5,872,257 A | 2/1999 | Beckman et al. | |
| 5,873,948 A | 2/1999 | Kim | |
| 5,881,577 A | 3/1999 | Sauer et al. | |
| 5,888,050 A | 3/1999 | Fitzgerald et al. | |
| 5,890,501 A | 4/1999 | Kaneko et al. | 134/1.3 |
| 5,893,756 A | 4/1999 | Berman et al. | |
| 5,896,870 A | 4/1999 | Huynh et al. | |
| 5,900,354 A | 5/1999 | Batchelder | |
| 5,904,737 A | 5/1999 | Preston et al. | |
| 5,908,510 A | 6/1999 | McCullough et al. | |
| 5,928,389 A | 7/1999 | Jevtic | |
| 5,932,100 A | 8/1999 | Yager et al. | |
| 5,944,996 A | 8/1999 | DeSimone et al. | |
| 5,954,101 A | 9/1999 | Drube et al. | |
| 5,955,140 A | 9/1999 | Smith et al. | |
| 5,965,025 A | 10/1999 | Wai et al. | |
| 5,976,264 A | 11/1999 | McCullough et al. | |
| 5,980,648 A | 11/1999 | Adler | |
| 5,992,680 A | 11/1999 | Smith | |
| 5,994,696 A | 11/1999 | Tai et al. | |
| 6,005,226 A | 12/1999 | Aschner et al. | |
| 6,017,820 A | 1/2000 | Ting et al. | |
| 6,021,791 A | 2/2000 | Dryer et al. | |
| 6,024,801 A | 2/2000 | Wallace et al. | |
| 6,037,277 A | 3/2000 | Masakara et al. | |
| 6,063,714 A | 5/2000 | Smith et al. | |
| 6,067,728 A | 5/2000 | Farmer et al. | |
| 6,085,762 A | 7/2000 | Barton | 134/25.4 |
| 6,099,619 A | 8/2000 | Lansbarkis et al. | |
| 6,100,198 A | 8/2000 | Grieger et al. | |
| 6,110,232 A | 8/2000 | Chen et al. | |
| 6,114,044 A | 9/2000 | Houston et al. | |
| 6,128,830 A | 10/2000 | Bettcher et al. | |
| 6,140,252 A | 10/2000 | Cho et al. | |
| 6,149,828 A | 11/2000 | Vaartstra | |
| 6,171,645 B1 | 1/2001 | Smith et al. | |
| 6,200,943 B1 | 3/2001 | Romack et al. | |
| 6,216,364 B1 | 4/2001 | Tanaka et al. | |
| 6,224,774 B1 | 5/2001 | DeSimone et al. | |
| 6,228,563 B1 | 5/2001 | Starov et al. | |
| 6,228,826 B1 | 5/2001 | DeYoung et al. | |
| 6,232,238 B1 | 5/2001 | Chang et al. | |
| 6,232,417 B1 | 5/2001 | Rhodes et al. | |
| 6,235,145 B1 | 5/2001 | Li et al. | 156/345 |
| 6,239,038 B1 | 5/2001 | Wen | |
| 6,242,165 B1 | 6/2001 | Vaartstra | |
| 6,251,250 B1 | 6/2001 | Keigler | |

| | | |
|---|---|---|
| 6,255,732 B1 | 7/2001 | Yokoyama et al. |
| 6,262,510 B1 | 7/2001 | Lungu ................ 310/254 |
| 6,270,531 B1 | 8/2001 | DeYoung et al. |
| 6,270,948 B1 | 8/2001 | Sato et al. |
| 6,277,753 B1 | 8/2001 | Mullee et al. |
| 6,284,558 B1 | 9/2001 | Sakamoto |
| 6,286,231 B1 | 9/2001 | Bergman et al. |
| 6,306,564 B1 | 10/2001 | Mullee |
| 6,319,858 B1 | 11/2001 | Lee et al. |
| 6,331,487 B2 | 12/2001 | Koch |
| 6,333,268 B1 | 12/2001 | Starov et al. |
| 6,344,243 B1 | 2/2002 | McClain et al. |
| 6,358,673 B1 | 3/2002 | Namatsu |
| 6,361,696 B1 | 3/2002 | Spiegelman et al. |
| 6,367,491 B1 | 4/2002 | Marshall et al. |
| 6,380,105 B1 | 4/2002 | Smith et al. |
| 6,425,956 B1 | 7/2002 | Cotte et al. |
| 6,431,185 B1 | 8/2002 | Tomita et al. ............ 134/1.3 |
| 6,436,824 B1 | 8/2002 | Chooi et al. |
| 6,454,945 B1 | 9/2002 | Weigl et al. |
| 6,458,494 B2 | 10/2002 | Song et al. |
| 6,461,967 B2 | 10/2002 | Wu et al. |
| 6,465,403 B2 | 10/2002 | Skee |
| 6,485,895 B1 | 11/2002 | Choi et al. |
| 6,486,078 B1 | 11/2002 | Rangarajan et al. |
| 6,492,090 B2 | 12/2002 | Nishi et al. |
| 6,500,605 B1 | 12/2002 | Mullee et al. |
| 6,509,141 B2 | 1/2003 | Mullee |
| 6,536,450 B1 | 3/2003 | Dolechek .............. 134/108 |
| 6,537,916 B2 | 3/2003 | Mullee et al. |
| 6,558,475 B1 | 5/2003 | Jur et al. |
| 6,561,220 B2 | 5/2003 | McCullough et al. .. 137/565.12 |
| 6,562,146 B1 | 5/2003 | DeYoung et al. |
| 6,596,093 B2 | 7/2003 | DeYoung et al. |
| 6,635,565 B2 | 10/2003 | Wu et al. |
| 6,641,678 B2 | 11/2003 | DeYoung et al. |
| 6,669,785 B2 | 12/2003 | DeYoung et al. ............ 134/3 |
| 6,764,552 B1 | 7/2004 | Joyce et al. |
| 6,848,458 B1 | 2/2005 | Shrinivasan et al. ........ 134/108 |
| 6,890,853 B2 | 5/2005 | Biberger et al. |
| 7,044,143 B2 | 5/2006 | DeYoung et al. ........... 134/105 |
| 2001/0019857 A1 | 9/2001 | Yokoyama et al. |
| 2001/0024247 A1 | 9/2001 | Nakata |
| 2001/0041455 A1 | 11/2001 | Yun et al. |
| 2001/0041458 A1 | 11/2001 | Ikakura et al. |
| 2002/0001929 A1 | 1/2002 | Biberger et al. |
| 2002/0014257 A1 | 2/2002 | Chandra et al. ............. 134/19 |
| 2002/0055323 A1 | 5/2002 | McClain et al. |
| 2002/0074289 A1 | 6/2002 | Sateria et al. |
| 2002/0081533 A1 | 6/2002 | Simons et al. |
| 2002/0088477 A1 | 7/2002 | Cotte et al. |
| 2002/0098680 A1 | 7/2002 | Goldstein et al. |
| 2002/0106867 A1 | 8/2002 | Yang et al. |
| 2002/0112740 A1 | 8/2002 | DeYoung et al. |
| 2002/0112746 A1 | 8/2002 | DeYoung et al. |
| 2002/0115022 A1 | 8/2002 | Messick et al. |
| 2002/0117391 A1 | 8/2002 | Beam |
| 2002/0123229 A1 | 9/2002 | Ono et al. |
| 2002/0127844 A1 | 9/2002 | Grill et al. |
| 2002/0132192 A1 | 9/2002 | Namatsu |
| 2002/0141925 A1 | 10/2002 | Wong et al. |
| 2002/0142595 A1 | 10/2002 | Chiou |
| 2002/0144713 A1 | 10/2002 | Kuo et al. ................. 134/18 |
| 2002/0150522 A1 | 10/2002 | Heim et al. |
| 2002/0164873 A1 | 11/2002 | Masuda et al. |
| 2003/0003762 A1 | 1/2003 | Cotte et al. |
| 2003/0008155 A1 | 1/2003 | Hayashi et al. ............ 428/447 |
| 2003/0008238 A1 | 1/2003 | Goldfarb et al. |
| 2003/0008518 A1 | 1/2003 | Chang et al. |
| 2003/0013311 A1 | 1/2003 | Chang et al. |
| 2003/0029479 A1 | 2/2003 | Asano ..................... 134/18 |
| 2003/0036023 A1 | 2/2003 | Moreau et al. |
| 2003/0047533 A1 | 3/2003 | Reid et al. |
| 2003/0051741 A1 | 3/2003 | DeSimone et al. |
| 2003/0081206 A1 | 5/2003 | Doyle ................... 356/301 |
| 2003/0106573 A1 | 6/2003 | Masuda et al. |
| 2003/0125225 A1 | 7/2003 | Xu et al. |
| 2003/0198895 A1 | 10/2003 | Toma et al. |
| 2003/0205510 A1 | 11/2003 | Jackson |
| 2003/0217764 A1 | 11/2003 | Masuda et al. |
| 2004/0011386 A1 | 1/2004 | Seghal |
| 2004/0018452 A1 | 1/2004 | Schilling .................. 430/314 |
| 2004/0020518 A1 | 2/2004 | DeYoung et al. |
| 2004/0045588 A1 | 3/2004 | DeYoung et al. ............. 134/26 |
| 2004/0048194 A1 | 3/2004 | Breyta et al. ............ 430/271.1 |
| 2004/0050406 A1 | 3/2004 | Sehgal ..................... 134/26 |
| 2004/0087457 A1 | 5/2004 | Korzenski et al. |
| 2004/0103922 A1 | 6/2004 | Inoue et al. |
| 2004/0112409 A1 | 6/2004 | Schilling |
| 2004/0118452 A1 | 6/2004 | Watkins et al. ............... 216/83 |
| 2004/0121269 A1* | 6/2004 | Liu et al. .................. 430/329 |
| 2004/0134515 A1 | 7/2004 | Castrucci |
| 2004/0168709 A1 | 9/2004 | Drumm et al. ............... 134/18 |
| 2004/0175958 A1 | 9/2004 | Lin et al. .................. 438/778 |
| 2004/0177867 A1 | 9/2004 | Schilling |
| 2004/0211440 A1 | 10/2004 | Wang et al. ................. 134/2 |
| 2004/0255978 A1 | 12/2004 | Fury et al. ................. 134/18 |
| 2004/0259357 A1 | 12/2004 | Saga |
| 2005/0191865 A1 | 9/2005 | Jacobsen et al. ............ 438/780 |
| 2006/0003592 A1 | 1/2006 | Gale et al. ................. 438/745 |
| 2006/0102204 A1* | 5/2006 | Jacobson et al. ............. 134/26 |
| 2006/0102208 A1 | 5/2006 | Jacobson et al. ............. 134/56 |
| 2006/0180175 A1 | 8/2006 | Parent ..................... 134/1.3 |

FOREIGN PATENT DOCUMENTS

| | | |
|---|---|---|
| DE | 40 04 111 C2 | 8/1990 |
| DE | 39 06 724 C2 | 9/1990 |
| DE | 39 06 735 C2 | 9/1990 |
| DE | 39 06 737 A1 | 9/1990 |
| DE | 44 29 470 A1 | 3/1995 |
| DE | 43 44 021 A1 | 6/1995 |
| EP | 0 283 740 A2 | 9/1988 |
| EP | 0 302 345 A2 | 2/1989 |
| EP | 0 370 233 A1 | 5/1990 |
| EP | 0 391 035 A2 | 10/1990 |
| EP | 0 518 653 B1 | 12/1992 |
| EP | 0 536 752 A2 | 4/1993 |
| EP | 0 572 913 A1 | 12/1993 |
| EP | 0 620 270 A3 | 10/1994 |
| EP | 0 679 753 B1 | 11/1995 |
| EP | 0 711 864 B1 | 5/1996 |
| EP | 0 726 099 A2 | 8/1996 |
| EP | 0 727 711 A2 | 8/1996 |
| EP | 0 822 583 A2 | 2/1998 |
| EP | 0 829 312 A2 | 3/1998 |
| EP | 0 836 895 A2 | 4/1998 |
| JP | 60-192333 | 9/1985 |
| JP | 1-045131 | 2/1989 |
| JP | 1-246835 | 10/1989 |
| JP | 2-209729 | 8/1990 |
| JP | 2-304941 | 12/1990 |
| JP | 7-142333 | 6/1995 |
| JP | 7-310192 | 11/1995 |
| JP | 8-186140 | 7/1996 |
| JP | 8-222508 | 8/1996 |
| JP | 9-213688 | 8/1997 |
| JP | 2000-114218 | 4/2000 |
| JP | 2004-317641 | 11/2004 |
| WO | WO 90/06189 | 6/1990 |
| WO | WO 90/13675 | 11/1990 |
| WO | WO 93/14255 | 7/1993 |
| WO | WO 93/14259 | 7/1993 |
| WO | WO 93/20116 | 10/1993 |
| WO | WO 96/27704 | 9/1996 |
| WO | WO 99/49998 | 10/1999 |

| | | | |
|---|---|---|---|
| WO | WO 00/73241 A1 | 12/2000 | |
| WO | WO 01/33613 A2 | 5/2001 | |
| WO | WO 01/87505 A1 | 11/2001 | |
| WO | WO 02/09894 A2 | 2/2002 | |
| WO | WO 02/11191 A2 | 2/2002 | |
| WO | WO 02/15251 A1 | 2/2002 | |
| WO | WO 02/16051 A2 | 2/2002 | |

OTHER PUBLICATIONS

"Los Almos National Laboratory," Solid State Technology, pp. S10 & S14, Oct. 1998.

"Supercritical Carbon Dioxide Resist Remover, SCORR, the Path to Least Photoresistance," Los Alamos National Laboratory, 1998.

Guan, Z. et al., "Fluorocarbon-Based Heterophase Polymeric Materials. 1. Block Copolymer Surfactants for Carbon Dioxide Applications," Macromolecules, vol. 27, 1994, pp. 5527-5532.

International Journal of Environmentally Conscious Design & Manufacturing, vol. 2, No. 1, 1993, p. 83.

Matson and Smith "Supercritical Fluids", Journal of the American Ceramic Society, vol. 72, No. 6, pp. 872-874.

Ziger, D.H. et al., "Compressed Fluid Technology: Application to RIE Developed Resists," AIChE Journal, vol. 33, No. 10, Oct. 1987, pp. 1585-1591.

Kirk-Othmer, "Alcohol Fuels to Toxicology," Encyclopedia of Chemical Terminology, 3rd ed., Supplement Volume, New York: John Wiley & Sons, 1984, pp. 872-893.

"Cleaning with Supercritical $CO_2$," NASA Tech Briefs, MFS-29611, Marshall Space Flight Center, Alabama, Mar. 1979.

Basta, N., "Supercritical Fluids: Still Seeking Acceptance," Chemical Engineering, vol. 92, No. 3, Feb. 24, 1985, p. 14.

Takahashi, D., "Los Alamos Lab Finds Way to Cut Chip Toxic Waste," Wall Street Journal, Jun. 22, 1998.

"Supercritical CO2 Process Offers Less Mess from Semiconductor Plants", Chemical Engineering Magazine, pp. 27 & 29, Jul. 1998.

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Jackson, K. et al., "Surfactants and Micromulsions in Supercritical Fluids," Supercritical Fluid Cleaning. Noyes Publications, Westwood, NJ, pp. 87-120, Spring 1998.

Kryszewski, M., "Production of Metal and Semiconductor Nanoparticles in Polymer Systems," Polimery, pp. 65-73, Feb. 1998.

Bakker, G.L. et al., "Surface Cleaning and Carbonaceous Film Removal Using High Pressure, High Temperature Water, and Water/C02 Mixtures," J. Electrochem. Soc, vol. 145, No. 1, pp. 284-291, Jan. 1998.

Ober, C.K. et al., "Imaging Polymers with Supercritical Carbon Dioxide," Advanced Materials, vol. 9, No. 13, 1039-1043, Nov. 3, 1997.

Russick, E.M. et al., "Supercritical Carbon Dioxide Extraction of Solvent from Micro-machined Structures." Supercritical Fluids Extraction and Pollution Prevention, ACS Symposium Series, vol. 670, pp. 255-269,Oct. 21, 1997.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270-279, Oct. 21, 1997.

Wai, C.M., "Supercritical Fluid Extraction: Metals as Complexes," Journal of Chromatography A, vol. 785, pp. 369-383, Oct. 17, 1997.

Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.

Tomioka Y, et al., "Decomposition of Tetramethylammonium (TMA) in a Positive Photo-resist Developer by Supercritical Water," Abstracts of Papers 214th ACS Natl Meeting, American Chemical Society, Abstract No. 108, Sep. 7, 1997.

Klein, H. et al., "Cyclic Organic Carbonates Serve as Solvents and Reactive Diluents," Coatings World, pp. 38-40, May 1997.

"Porous Xerogel Films as Ultra-Low Permittivity Dielectrics for ULSI Interconnect Applications", Materials Research Society, pp. 463-469, 1997.

Kawakami et al, "A Super Low-k (k=1.1) Silica Aerogel Film Using Supercritical Drying Technique", IEEE, pp. 143-145, 2000.

R.F. Reidy, "Effects of Supercritical Processing on Ultra Low-K Films", Texas Advanced Technology Program, Texas Instruments, and the Texas Academy of Mathematics and Science.

Anthony Muscat, "Backend Processing Using Supercritical CO2", University of Arizona.

D. Goldfarb et al., "Aqueous-based Photoresist Drying Using Supercritical Carbon Dioxide to Prevent Pattern Collapse", J. Vacuum Sci. Tech. B 18 (6), 3313 (2000).

H. Namatsu et al., "Supercritical Drying for Water-Rinsed Resist Systems", J. Vacuum Sci. Tech. B 18 (6), 3308 (2000).

N. Sundararajan et al., "Supercritical CO2 Processing for Submicron Imaging of Fluoropolymers", Chem. Mater. 12, 41 (2000).

Matson and Smith "Supercritical Fluids", Journal of the American Ceramic Society, vol. 72, No. 6, pp. 872-874. Jun. 1989.

Bühler, J. et al., Linear Array of Complementary Metal Oxide Semiconductor Double-Pass Metal Micro-mirrors, Opt. Eng., vol. 36, No. 5, pp. 1391-1398, May 1997.

Jo, M.H. et al., Evaluation of SIO2 Aerogel Thin Film with Ultra Low Dielectric Constant as an Intermetal Dielectric, Microelectronic Engineering, vol. 33, pp. 343-348, Jan. 1997.

McClain, J.B. et al., "Design of Nonionic Surfactants for Supercritical Carbon Dioxide," Science, vol. 274, Dec. 20, 1996. pp. 2049-2052.

Znaidi, L. et al., "Batch and Semi-Continuous Synthesis of Magnesium Oxide Powders from Hydrolysis and Supercritical Treatment of Mg(OCH3)2," Materials Research Bulletin, vol. 31, No. 12, pp. 1527-1335, Dec. 1996.

Tadros, M.E., "Synthesis of Titanium Dioxide Particles in Supercritical CO2," J. Supercritical Fluids, vol. 9, pp. 172-176, Sep. 1996.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.

Gabor, A, et al., "Block and Random Copolymer resists Designed for 193 nm Lithography and Environmentally Friendly Supercritical CO2 Development," SPIE, vol. 2724, pp. 410-417, Jun. 1996.

Schimek, G. L. et al., "Supercritical Ammonia Synthesis and Characterization of Four New Alkali Metal Silver Antimony Sulfides . . . ," J. Solid State Chemistry, vol. 123 pp. 277-284, May 1996.

Gallagher-Wetmore, P. et al., "Supercritical Fluid Processing: Opportunities for New Resist Materials and Processes," SPIE, vol. 2725, pp. 289-299, Apr. 1996.

Papathomas, K.I. et al., "Debonding of Photoresists by Organic Solvents," J. Applied Polymer Science, vol. 59, pp. 2029-2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991-1994.

Gloyna, E.F. et al., "Supercritical Water Oxidation Research and Development Update," Environmental Progress, vol. 14, No. 3. pp. 182-192, Aug. 1995.

Gallagher-Wetmore, P. et al., "Supercritical Fluid Processing: A New Dry Technique for Photoresist Developing," SPIE vol. 2438, pp. 694-708, Jun. 1995.

Gabor, A. H. et al., "Silicon-Containing Block Copolymer Resist Materials," Microelectronics Technology—Polymers for Advanced Imaging and Packaging, ACS Symposium Series, vol. 614, pp. 281-298, Apr. 1995.

Tsiartas, P.C. et al., "Effect of Molecular weight Distribution on the Dissolution Properties of Novolac Blends," SPIE, vol. 2438, pp. 264-271, Jun. 1995.

Allen, R.D. et al., "Performance Properties of Near-monodisperse Novolak Resins,"SPIE, vol. 2438, pp. 250-260, Jun. 1995.

Wood, P.T. et al., "Synthesis of New Channeled Structures in Supercritical Amines . . . ," Inorg. Chem., vol. 33, pp. 1556-1558, 1994.

Jerome, J.E. et al., "Synthesis of New Low-Dimensional Quaternary Compounds . . . ," Inorg. Chem, vol. 33, pp. 1733-1734, 1994.

McHardy, J. et al., "Progress in Supercritical CO2 Cleaning," SAMPE Jour., vol. 29, No. 5, pp. 20-27, Sep. 1993.

Purtell, R, et al., "Precision Parts Cleaning Using Supercritical Fluids," J. Vac, Sci, Technol. A. vol. 11, No. 4, Jul. 1993, pp. 1691-1701.

Bok, E, et al., "Supercritical Fluids for Single Wafer Cleaning," Solid State Technology, pp. 117-120, Jun. 1992.

Adschiri, T. et al., "Rapid and Continuous Hydrothermal Crystallization of Metal Oxide Particles in Supercritical Water," J. Am. Ceram. Soc.; vol. 75, No. 4, pp. 1019-1022, 1992.

Hansen, B.N. et al., "Supercritical Fluid Transport—Chemical Deposition of Films,"Chem. Mater., vol. 4, No. 4, pp. 749-752, 1992.

Page, S.H. et al., "Predictability and Effect of Phase Behavior of CO2/ Propylene Carbonate in Supercritical Fluid Chromatography," J. Microcol, vol. 3, No. 4, pp. 355-369, 1991.

Brokamp, T. et al., "Synthese und Kristallstruktur Eines Gemischtvalenten Lithium-Tantalnitrids Li2Ta3N5," J. Alloys and Compounds, vol. 176. pp. 47-60, 1991.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D. H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powers, Thin Films, and Fibers," Ind. Eng. Chem. Res., vol. 26, No. 11, pp. 2298-2306, 1987.

Tolley W.K. et al., "Stripping Organics from Metal and Mineral Surfaces using Supercritical Fluids," Separation Science and Technology, vol. 22, pp. 1087-1101, 1987.

"Final Report on the Safety Assessment of Propylene Carbonate", J. American College of Toxicology, vol. 6, No. 1, pp. 23-51, 1987.

R.F. Reidy, "Effects of Supercritical Processing on Ultra Low-K Films", Texas Advanced Technology Program, Texas Instruments, and the Texas Academy of Mathematics and Science, Oct. 2002.

Anthony Muscat, "Backend Processing Using Supercritical CO2", University of Arizona, May, 2003.

US 6,001,133, 12/1999, DeYoung et al. (withdrawn)

US 6,486,282, 11/2002, Dammel et al. (withdrawn)

* cited by examiner

METHOD OF INHIBITING COPPER CORROSION DURING SUPERCRITICAL $CO_2$ CLEANING

This patent application is related to commonly owned co-pending U.S. patent application Ser. No. 11/094,939, filed Mar. 30, 2005, entitled "METHOD OF TREATING A COMPOSITE SPIN-ON GLASS/ANTI-REFLECTIVE MATERIAL PRIOR TO CLEANING", U.S. patent application Ser. No. 11/094,876, filed Mar. 30, 2005, entitled "ISOTHERMAL CONTROL OF A PROCESS CHAMBER", U.S. patent application Ser. No. 11/094,938, filed Mar. 30, 2005, entitled "NEUTRALIZATION OF SYSTEMIC POISONING IN WAFER PROCESSING", U.S. patent application Ser. No. 11/094,882, filed Mar. 30, 2005, entitled "REMOVAL OF POROGENS AND POROGEN RESIDUES USING SUPERCRITICAL CO2", U.S. patent application Ser. No. 11/094,936, filed Mar. 30, 2005 entitled "ISOLATION GATE-VALVE FOR PROCESS CHAMBER", U.S. patent application Ser. No. 11/065,636, filed Feb. 23, 2005 entitled "IMPROVED RINSING STEP IN SUPERCRITICAL PROCESSING", U.S. patent application Ser. No. 11/065,377, filed Feb. 23, 2005, entitled "IMPROVED CLEANING STEP IN SUPERCRITICAL PROCESSING", U.S. patent application Ser. No. 11/065,376, filed Feb. 23, 2005, entitled "ETCHING AND CLEANING BPSG MATERIAL USING SUPERCRITICAL PROCESSING", U.S. patent application Ser. No. 11/091,976, filed Mar. 28, 2005, entitled "HIGH PRESSURE FOURIER TRANSFORM INFRARED CELL", and U.S. patent application Ser. No. 11/092,232, filed Mar. 28, 2005, entitled "PROCESS FLOW THERMOCOUPLE", which are hereby incorporated by reference in its entirety.

FIELD OF THE INVENTION

The present invention relates to the field of cleaning features on semiconductor devices or other objects. More particularly, the present invention relates to the field of cleaning substrates with exposed copper vias using supercritical processing.

BACKGROUND OF THE INVENTION

It is well known in the industry that particulate surface contamination of semiconductor wafers typically degrades device performance and affects yield. When processing wafers, it is desirable that particles and contaminants such as, but not limited to, photoresist, photoresist residue, and residual etching reactants and byproducts be minimized.

A problem in semiconductor manufacturing is that the chemicals used in cleaning steps can react with exposed metal surfaces and corrode/oxidize the exposed metal surfaces. It would be advantageous to prevent or reduce corrosion/oxidation of exposed metal surfaces that can occur during cleaning steps.

SUMMARY OF THE INVENTION

One embodiment of the present invention includes a method for the pre-treatment of a wafer that has exposed metal surfaces. The pre-treatment prevents of reduces the amount of oxidation to exposed metal surfaces, and can eliminate the need for a cap layer.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

The present invention is directed to an apparatus and methods of pre-treating a substrate using supercritical processing. The methods and apparatus in accordance with the present invention utilizes the low viscosity, high solvating and solubilizing properties of supercritical carbon dioxide to assist in a corrosion inhibiting process. For purposes of the invention, "carbon dioxide" should be understood to refer to carbon dioxide ($CO_2$) employed as a fluid in a liquid, gaseous or supercritical (including near supercritical) state. "Supercritical carbon dioxide" refers herein to $CO_2$ at conditions above the critical temperature (31.3° C.) and critical pressure (7.38 MPa). When $CO_2$ is subjected to pressures and temperatures above 7.38 MPa and 30.5° C., respectively, it is determined to be in the supercritical state. "Near-supercritical carbon dioxide" refers to $CO_2$ at about 85% of the critical temperature and critical pressure.

Various objects can be processes using the apparatus and methods of the present invention. For the purposes of the invention, "object" typically refers to semiconductor wafers, substrates, and other media requiring low contamination levels. As used herein, "substrate" includes a wide variety of structures such as semiconductor device structures typically with a deposited photoresist or residue. A substrate can be a single layer of material, or can include any number of layers. A substrate can comprise various materials, including semiconductors, metals, ceramics, glass, or compositions thereof.

A wide variety of materials can be effectively pre-treated using the methods and apparatus of the invention. For example, a substrate can comprise a low-k material, or an ultra-low-k material, or a combination thereof. The methods and apparatus of the invention are particularly advantageous for pre-treating materials having thicknesses up to approximately 2.0 microns and having critical dimensions below approximately 0.25 microns.

Figure 1:
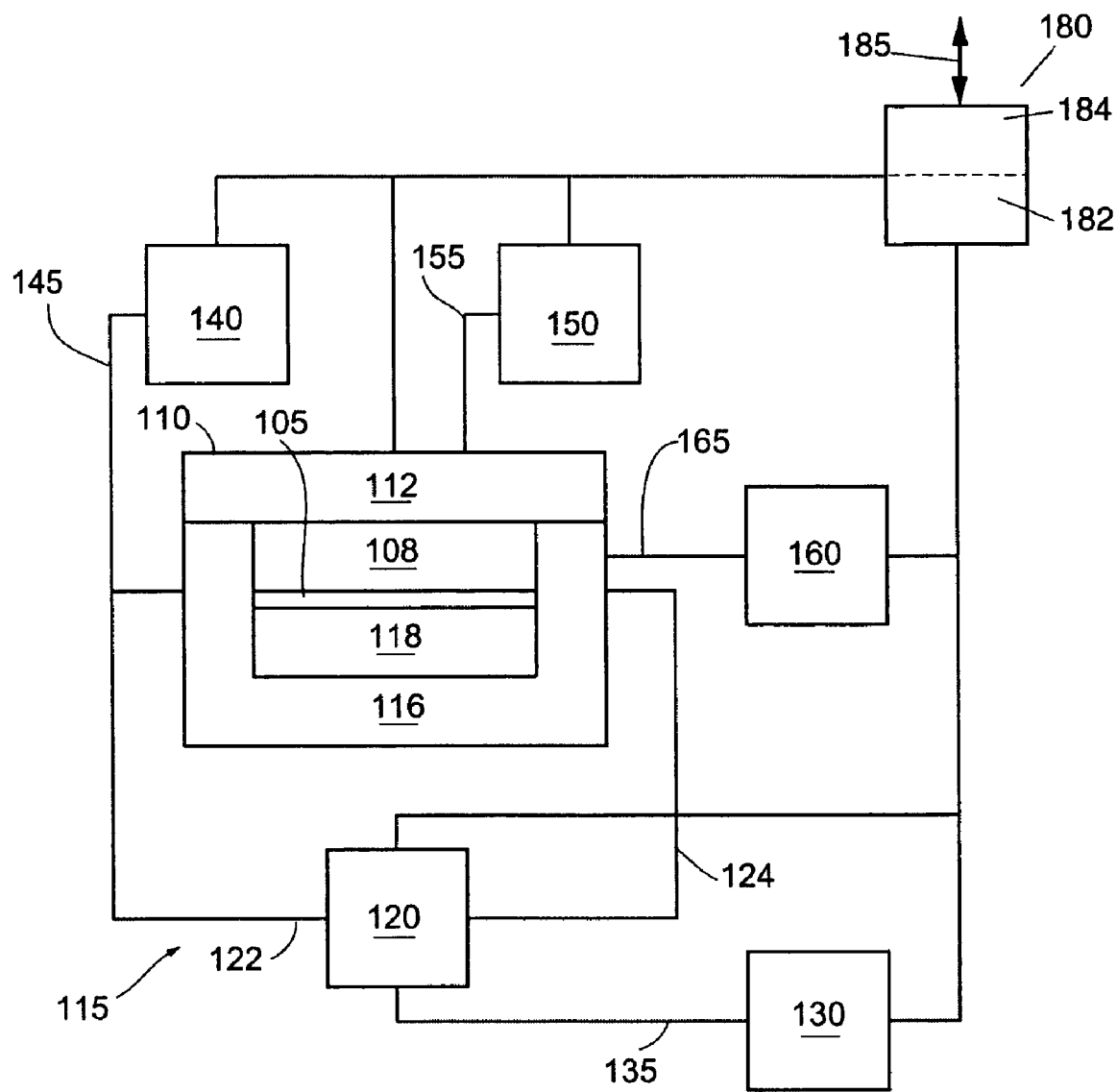
FIG. 1 shows an exemplary block diagram of a processing system, in accordance with an embodiment of the invention.

FIG. 1 shows an exemplary block diagram of a processing system 100 in accordance with an embodiment of the invention. In the illustrated embodiment, processing system 100 comprises a process module 110, a recirculation system 120, a process chemistry supply system 130, a high-pressure fluid supply system 140, a pressure control system 150, an exhaust system 160, and a controller 180. The processing system 100 can operate at pressures that can range from 1000 psi. to 10,000 psi. In addition, the processing system 100 can operate at temperatures that can range from 40 to 300 degrees Celsius.

The details concerning one example of a processing chamber are disclosed in co-owned and co-pending U.S. patent application Ser. No. 09/912,844, entitled "HIGH PRESSURE PROCESSING CHAMBER FOR SEMICONDUCTOR SUBSTRATE," filed Jul. 24, 2004, Ser. No. 09/970,309, entitled "HIGH PRESSURE PROCESSING CHAMBER FOR MULTIPLE SEMICONDUCTOR SUBSTRATES," filed Oct. 3, 2001, Ser. No. 10/121,791, entitled "HIGH PRESSURE PROCESSING CHAMBER FOR SEMICONDUCTOR SUBSTRATE INCLUDING FLOW ENHANCING FEATURES," filed Apr. 10, 2002, and Ser. No. 10/364,284, entitled "HIGH-PRESSURE PROCESSING CHAMBER FOR A SEMICONDUCTOR WAFER," filed Feb. 10, 2003, the contents of which are all incorporated herein by reference.

The controller 180 can be coupled to the process module 110, the recirculation system 120, the process chemistry supply system 130, the high-pressure fluid supply system 140, the pressure control system 150, and the exhaust system 160. Alternately, controller 180 can be coupled to one or more additional controllers/computers (not shown), and controller 180 can obtain setup, configuration, and/or recipe information from an additional controller/computer.

In FIG. 1, singular processing elements (110, 120, 130, 140, 150, 160, and 180) are shown, but this is not required for the invention. The semiconductor processing system 100 can comprise any number of processing elements having any number of controllers associated with them in addition to independent processing elements.

The controller 180 can be used to configure any number of processing elements (110, 120, 130, 140, 150, and 160), and the controller 180 can collect, provide, process, store, and display data from processing elements. The controller 180 can comprise a number of applications for controlling one or more of the processing elements. For example, controller 180 can include a Graphical User Interface (GUI) component (not shown) that can provide easy to use interfaces that enable a user to monitor and/or control one or more processing elements.

The process module 110 can include an upper assembly 112 and a lower assembly 116, and the upper assembly 112 can be coupled to the lower assembly 116. In an alternate embodiment, a frame and or injection ring (not shown) can be included and may be coupled to an upper assembly 112 and a lower assembly 116. The upper assembly 112 can comprise a heater (not shown) for heating the process chamber 108, the substrate 105, or the processing fluid, or any combination thereof. Alternately, a heater is not required in the upper assembly 112. In another embodiment, the lower assembly 116 can comprise a heater (not shown) for heating the process chamber, the substrate, or the processing fluid, or a combination of two or more thereof. The process module 110 can include means for flowing a processing fluid through the processing chamber 108. In one example, a circular flow pattern can be established, and in another example, a substantially linear flow pattern can be established. Alternately, the means for flowing can be configured differently. The lower assembly 116 can comprise one or more lifters (not shown) for moving a chuck 118 and/or the substrate 105. Alternately, a lifter is not required.

In one embodiment, the process module 110 can include a holder or the chuck 118 for supporting and holding the substrate 105 while processing the substrate 105. The holder or chuck 118 can also be configured to heat or cool the substrate 105 before, during, and/or after processing the substrate 105. Alternately, the process module 110 can include a platen for supporting and holding the substrate 105 while processing the substrate 105.

A transfer system (not shown) can be used to move a substrate into and out of the processing chamber 108 through a slot (not shown). In one example, the slot can be opened and closed by moving the chuck 118, and in another example, the slot can be controlled using a gate valve (not shown).

The substrate 105 can include semiconductor material, metallic material, dielectric material, ceramic material, or polymeric material, or a combination of two or more thereof. The semiconductor material can include elements of Si, Ge, Si/Ge, or GaAs. The metallic material can include elements of Cu, Al, Ni, Pb, Ti, Ta, Co, or W, or combinations of two or more thereof. The dielectric material can include elements of Si, O, N, or C, or combinations of two or more thereof. The ceramic material can include elements of Al, N, Si, C, or O, or combinations of two or more thereof.

The recirculation system 120 can be coupled to the process module 110 using one or more inlet lines 122 and one or more outlet lines 124. The recirculation system 120 can comprise one or more valves (not shown) for regulating the flow of a supercritical processing solution through the recirculation system 120 and through the process module 110. The recirculation system 120 can comprise any number of back-flow valves, filters, pumps, and/or heaters (not shown) for maintaining a supercritical processing solution and flowing the supercritical process solution through the recirculation system 120 and through the processing chamber 108 in the process module 110.

In the illustrated embodiment, the chemistry supply system 130 is coupled to the recirculation system 120 using one or more lines 135, but this is not required for the invention. In alternate embodiments, the chemical supply system 130 can be configured differently and can be coupled to different elements in the processing system 100. For example, the chemistry supply system 130 can be directly coupled to the process module 110.

Process chemistry is preferably introduced by the process chemistry supply system 130 into a fluid stream by the high-pressure fluid supply system 140 at ratios that vary with the substrate properties, the chemistry being used, and the process being performed in the processing module 110. The ratio can vary from approximately 0.001 to approximately 15 percent by volume. For example, when a recirculation loop 115 comprising the process chamber 108, the recirculation system 120 and lines 122 and 14 has a volume of about one liter, the process chemistry volumes can range from approximately ten micro liters to approximately one hundred fifty milliliters. In alternate embodiments, the volume and/or the ratio may be higher or lower.

The chemistry supply system 130 can comprise pre-treating chemistry assemblies (not shown) for providing pre-treating chemistry for generating supercritical pre-treating solutions within the processing chamber 108. The pre-treating chemistry can include a high polarity solvent. For example, alcohols, organic acids, and inorganic acids that can be introduced into supercritical carbon dioxide with one or more carrier solvents, such as water or alcohols (such a methanol, ethanol and 1-propanol).

In other embodiments, the pre-treatment chemistry can include nitrogen-based and/or sulfur-based inhibitors. These may include 2-aminopyrimidine (AP), 2-amino-5-mercapto-1,3,4-thiadiazole (AMT), benzotriazole (BTA), 5,6-dimethylbenzimidazole (DB), 2-mercaptobenzimidazole (MBI), 2-mercaptobenzoxazole (MBO), 2-mercaptopyrimidine (MP) and 2-mercaptobenzothiazole (MBT).

The chemistry supply system 130 can comprise a rinsing chemistry assembly (not shown) for providing rinsing chemistry for generating supercritical rinsing solutions within the processing chamber 108. The rinsing chemistry can include one or more organic solvents including, but not limited to, alcohols and ketones. In one embodiment, the rinsing chemistry can comprise an alcohol and a carrier solvent. The chemistry supply system 130 can comprise a drying chemistry assembly (not shown) for providing drying chemistry for generating supercritical drying solutions within the processing chamber 108.

In addition, the process chemistry can include chelating agents, complexing agents, oxidants, organic acids, and inorganic acids that can be introduced into supercritical carbon dioxide with one or more carrier solvents, such as N,N-dimethylacetamide (DMAc), gamma-butyrolactone (BLO), dimethyl sulfoxide (DMSO), ethylene carbonate (EC), N-methylpyrrolidone (NMP), dimethylpiperidone, propylene carbonate, and alcohols (such a methanol, ethanol and 1-propanol).

Furthermore, the process chemistry can include solvents, co-solvents, surfactants, and/or other ingredients. Examples of solvents, co-solvents, and surfactants are disclosed in co-owned U.S. Pat. No. 6,500,605, entitled "REMOVAL OF PHOTORESIST AND RESIDUE FROM SUBSTRATE USING SUPERCRITICAL CARBON DIOXIDE PROCESS", issued Dec. 31, 2002, and U.S. Pat. No. 6,277,753, entitled "REMOVAL OF CMP RESIDUE FROM SEMICONDUCTORS USING SUPERCRITICAL CARBON DIOXIDE PROCESS", issued Aug. 21, 2001, both are incorporated by reference herein.

As shown in FIG. 1, the high-pressure fluid supply system 140 can be coupled to the recirculation system 120 using one or more lines 145, but this is not required. The inlet line 145 can be equipped with one or more back-flow valves, and/or heaters (not shown) for controlling the fluid flow from the high-pressure fluid supply system 140. In alternate embodiments, high-pressure fluid supply system 140 can be configured differently and coupled differently. For example, the high-pressure fluid supply system 140 can be directly coupled to the process module 110.

The high-pressure fluid supply system 140 can comprise a carbon dioxide source (not shown) and a plurality of flow control elements (not shown) for generating a supercritical fluid. For example, the carbon dioxide source can include a $CO_2$ feed system, and the flow control elements can include supply lines, valves, filters, pumps, and heaters. The high-pressure fluid supply system 140 can comprise an inlet valve (not shown) that is configured to open and close to allow or prevent the stream of supercritical carbon dioxide from flowing into the processing chamber 108. For example, controller 180 can be used to determine fluid parameters such as pressure, temperature, process time, and flow rate.

As shown in FIG. 1, the pressure control system 150 can be coupled to the process module 110 using one or more lines 155, but this is not required. Line 155 can be equipped with one or more back-flow valves, and/or heaters (not shown) for controlling the fluid flow to pressure control system 150. In alternate embodiments, pressure control system 150 can be configured differently and coupled differently. The pressure control system 150 can include one or more pressure valves (not shown) for exhausting the processing chamber 108 and/or for regulating the pressure within the processing chamber 108. Alternately, the pressure control system 150 can also include one or more pumps (not shown). For example, one pump may be used to increase the pressure within the processing chamber 108, and another pump may be used to evacuate the processing chamber 108. In another embodiment, the pressure control system 150 can comprise means for sealing the processing chamber 108. In addition, the pressure control system 150 can comprise means for raising and lowering the substrate 105 and/or the chuck 118.

As shown in FIG. 1, the exhaust control system 160 can be coupled to the process module 110 using one or more lines 165, but this is not required. Line 165 can be equipped with one or more back-flow valves, and/or heaters (not shown) for controlling the fluid flow to the exhaust control system 160. In alternate embodiments, exhaust control system 160 can be configured differently and coupled differently. The exhaust control system 160 can include an exhaust gas collection vessel (not shown) and can be used to remove contaminants from the processing fluid. Alternately, the exhaust control system 160 can be used to recycle the processing fluid.

In one embodiment, controller 180 can comprise a processor 182 and a memory 184. Memory 184 can be coupled to processor 182, and can be used for storing information and instructions to be executed by processor 182. Alternately, different controller configurations can be used. In addition, controller 180 can comprise a port 185 that can be used to couple processing system 100 to another system (not shown). Furthermore, controller 180 can comprise any number of input and/or output devices (not shown).

In addition, one or more of the processing elements (110, 120, 130, 140, 150, 160, and 180) can include memory (not shown) for storing information and instructions to be executed during processing and processors for processing information and/or executing instructions. For example, the memory may be used for storing temporary variables or other intermediate information during the execution of instructions by the various processors in the system. One or more of the processing elements (110, 120, 130, 140, 150, 160, and 180) can comprise the means for reading data and/or instructions from a computer readable medium. In addition, one or more of the processing elements (110, 120, 130, 140, 150, 160, and 180) can comprise the means for writing data and/or instructions to the computer readable medium.

Memory devices can include at least one computer readable medium or memory for holding computer-executable instructions programmed according to the teachings of the invention and for containing data structures, tables, records, or other data described herein. Controller 180 can use pre-process data, process data, and post-process data. For example, pre-process data can be associated with an incoming substrate. This pre-process data can include lot data, batch data, run data, composition data, and history data. The pre-process data can be used to establish an input state for a wafer. Process data can include process parameters. Post processing data can be associated with a processed substrate.

The processing system 100 can perform all or a portion of the processing steps of the invention in response to the controller 180 executing one or more sequences of one or more computer-executable instructions contained in a memory. Such instructions may be received by the controller 180 from another computer, a computer readable medium, or a network connection.

Stored on any one or on a combination of computer readable media, the present invention includes software for controlling the processing system 100, for driving a device or devices for implementing the invention, and for enabling the processing system 100 to interact with a human user and/or another system, such as a factory system. Such software may include, but is not limited to, device drivers, operating systems, development tools, and applications software. Such computer readable media further includes the computer program product of the present invention for performing all or a portion (if processing is distributed) of the processing performed in implementing the invention.

The term "computer readable medium" as used herein refers to any medium that participates in providing instructions to a processor for execution and/or that participates in storing information before, during, and/or after executing an instruction. A computer readable medium may take many forms, including but not limited to, non-volatile media, volatile media, and transmission media. The term "computer-executable instruction" as used herein refers to any computer code and/or software that can be executed by a processor, that provides instructions to a processor for execution and/or that participates in storing information before, during, and/or after executing an instruction.

Controller 180, processor 182, memory 184 and other processors and memory in other system elements as described thus far can, unless indicated otherwise below, be constituted by components known in the art or constructed according to principles known in the art. The computer readable medium and the computer executable instructions can also, unless indicated otherwise below, be constituted by components known in the art or constructed according to principles known in the art.

Controller 180 can use the port 185 to obtain computer code and/or software from another system (not shown), such as a factory system. The computer code and/or software can be used to establish a control hierarchy. For example, the processing system 100 can operate independently, or can be controlled to some degree by a higher-level system (not shown).

The controller 180 can use data from one or more of the system components to determine when to alter, pause, and/or stop a process. The controller 180 can use the data and operational rules to determine when to change a process and how to change the process, and rules can be used to specify the action taken for normal processing and the actions taken on exceptional conditions. Operational rules can be used to determine which processes are monitored and which data is used. For example, rules can be used to determine how to manage the data when a process is changed, paused, and/or stopped. In general, rules allow system and/or tool operation to change based on the dynamic state of the system 100.

Controller 180 can receive, send, use, and/or generate pre-process data, process data, and post-process data, and this data can include lot data, batch data, run data, composition data, and history data. Pre-process data can be associated with an incoming substrate and can be used to establish an input state for a substrate and/or a current state for a process module. Process data can include process parameters. Post processing data can be associated with a processed substrate and can be used to establish an output state for a substrate.

The controller 180 can use the pre-process data to predict, select, or calculate a set of process parameters to use to process the substrate 105. The pre-process data can include data describing the substrate 105 to be processed. For example, the pre-process data can include information concerning the substrate's materials, the number of layers, the materials used for the different layers, the thickness of materials in the layers, the size of vias and trenches, and a desired process result. The pre-process data can be used to determine a process recipe and/or process model. A process model can provide the relationship between one or more process recipe parameters and one or more process results. A process recipe can include a multi-step process involving a set of process modules. Post-process data can be obtained at some point after the substrate 105 has been processed. For example, post-process data can be obtained after a time delay that can vary from minutes to days.

The controller 180 can compute a predicted state for the substrate 105 based on the pre-process data, the process characteristics, and a process model. For example, a pre-treatment model can be used along with a material type and thickness to compute a predicted time for the corrosion-inhibiting process. In addition, a cleaning/rinsing rate model can be used along with a residue type and amount to compute a processing time for a cleaning/rinsing process.

In one embodiment, the substrate can comprise at least one of a semiconductor material, a metallic material, a polysilicon material, and a photoresist material. For example, the photoresist material can include photoresist and/or photoresist residue. One process recipe can include steps for depositing one or more corrosion-inhibiting materials onto patterned or un-patterned low-k material. Another process recipe can include steps for depositing one or more corrosion-inhibiting materials, removing photoresist material, and/or removing the residues.

It will be appreciated that the controller 180 can perform other functions in addition to those discussed here. The controller 180 can monitor the pressure, temperature, flow, or other variables associated with the processing system 100 and take actions based on these values. For example, the controller 180 can process measured data, display data and/or results on a screen, determine a fault condition, determine a response to a fault condition, and alert an operator. The controller 180 can comprise a database component (not shown) for storing input and output data.

Figure 2:
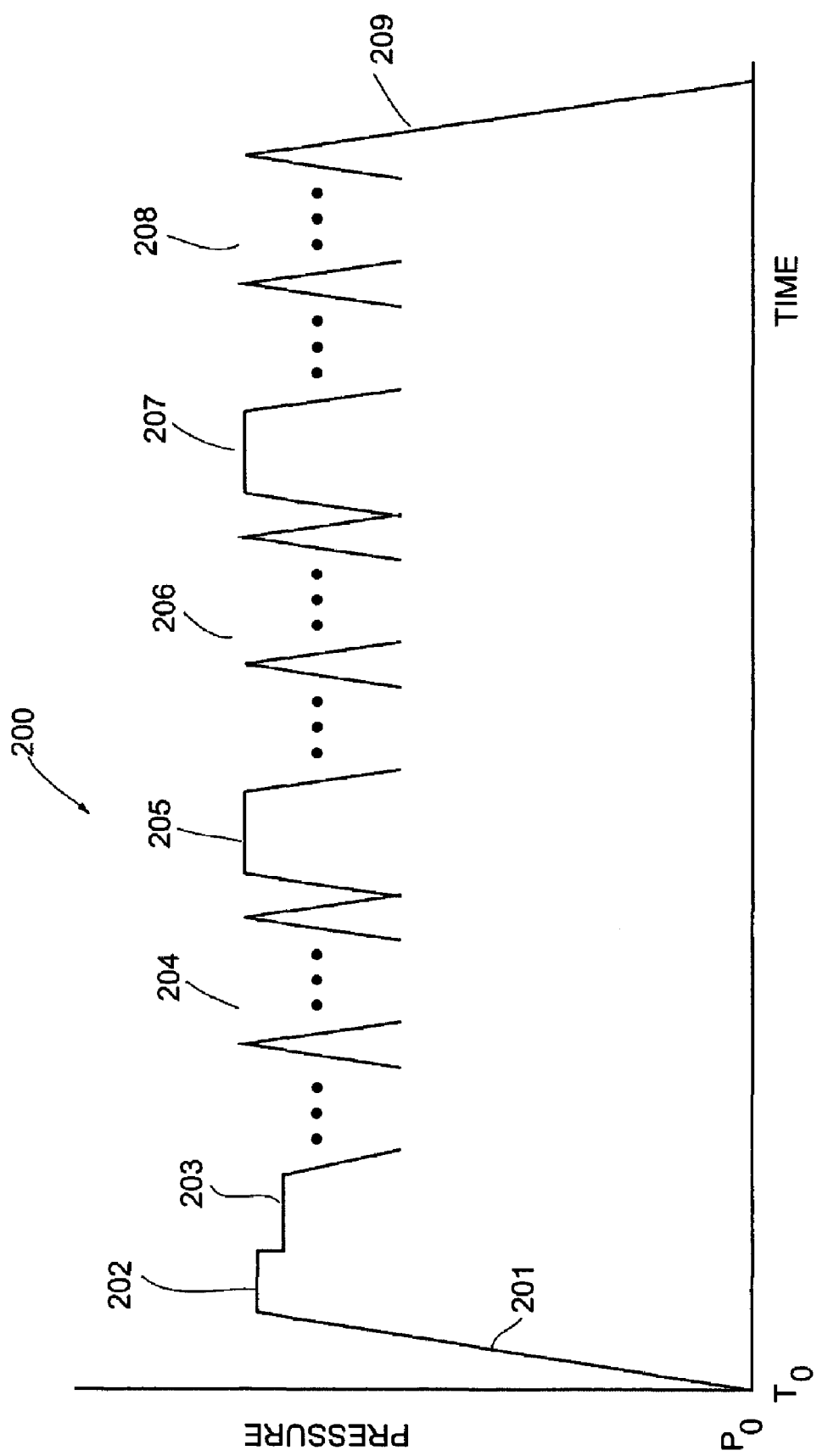
FIG. 2 illustrates exemplary graphs of pressure versus time for supercritical processes, in accordance with embodiments of the invention.

FIG. 2 illustrates an exemplary graph of pressure versus time for a supercritical process step in accordance with an embodiment of the invention. In the illustrated embodiment, a graph 200 of pressure versus time is shown, and the graph 200 can be used to represent a supercritical pre-treatment process. Alternately, different pressures, different timing, and different sequences may be used for different processes.

Referring to FIGS. 1 and 2, prior to an initial time $T_0$, the substrate 105 to be processed can be placed within the processing chamber 108 and the processing chamber 108 can be sealed. During a pre-treatment process, a substrate 105 having dielectric material and exposed metallic surfaces can be positioned in the chamber 108. In one embodiment, a substrate can comprise exposed copper vias and/or trenches. The substrate, the processing chamber, and the other elements in the recirculation loop 115 (FIG. 1) can be heated to an operational temperature. For example, the operational temperature can range from 40 to 300 degrees Celsius.

During a first time 201, the processing chamber 108 and the other elements in the recirculation loop 115 can be pressurized. For example, a supercritical fluid, such as substantially pure $CO_2$, can be used to pressurize the processing chamber 108 and the other elements in the recirculation loop 115 (FIG. 1). During time 201, a pump (not shown), can be started and can be used to circulate the supercritical fluid through the processing chamber 108 and the other elements in the recirculation loop 115 (FIG. 1). For example, the recirculation system 120 can comprise a recirculation pump. In an alternate embodiment, process chemistry may be injected during time 201.

During a second time 202, process chemistry can be introduced. In one embodiment, when the pressure in the processing chamber 108 exceeds a critical pressure Pc (1,070 psi), process chemistry can be injected into the processing chamber 108, using the process chemistry supply system 130. For example, the injection(s) of the process chemistries can begin upon reaching about 1100-1200 psi. In alternate embodiments, process chemistry may be injected into the processing chamber 108 before the pressure exceeds the critical pressure Pc (1,070 psi) using the process chemistry supply system 130. In one embodiment, process chemistry is injected in a linear fashion, and the injection time can be based on a recirculation time. For example, the recirculation time can be determined based on the length of the recirculation path and the flow rate. In other embodiments, process chemistry may be injected in a non-linear fashion. For example, process chemistry can be injected in one or more steps.

The process chemistry can include a pre-treating agent, or a cleaning agent, or a rinsing agent, or a drying agent, or a combination thereof that is injected into the supercritical fluid. One or more injections of process chemistries can be performed during time 202 to generate a supercritical processing solution with the desired concentrations of chemicals. The process chemistry, in accordance with the embodiments of the invention, can also include one or more carrier solvents.

During the second time 202, the supercritical processing solution can also be re-circulated over the substrate 105 and through the processing chamber 108 using the recirculation system 120, such as described above. In one embodiment, process chemistry is not injected during the second time 202. Alternatively, process chemistry may be injected into the processing chamber 108 before the second time 202 or after the second time 202.

In one embodiment, the process chemistry used during one or more steps in a corrosion inhibiting pre-treatment process can include a high polarity solvent. Solvents, such as alcohols and water, can be used. In another embodiment, the process chemistry used can include alcohol, acetic acid, and water.

The processing chamber 108 can operate at a pressure above 2,200 psi during the second time 202. For example, the pressure can range from approximately 2,500 psi to approximately 3,500 psi, but can be any value so long as the operating pressure is sufficient to maintain supercritical conditions. The supercritical conditions within the processing chamber 108 and the other elements in the recirculation loop 115 (FIG. 1) are maintained during the second time 202, and the supercritical processing solution continues to be circulated over the substrate and through the processing chamber 108 and the other elements in the recirculation loop 115 (FIG. 1). A pump (not shown), can be used to regulate the flow of the supercritical processing solution through the processing chamber 108 and the other elements in the recirculation loop 115 (FIG. 1).

In one embodiment, during the second time 202, the pressure can be substantially constant. Alternately, the pressure may have different values during different portions of the second time 202.

In one embodiment, the process chemistry used during one or more steps in a corrosion inhibiting process can be injected at a pressure above approximately 2200 psi and circulated at a pressure above approximately 2700 psi. In an alternate embodiment, the process chemistry used during one or more steps in a corrosion inhibiting process can be injected at a pressure above approximately 2500 psi and circulated at a pressure above approximately 2500 psi.

During a third time 203, a push-through process can be performed. In an alternate embodiment, a push-through process may not be required after each corrosion-inhibiting step. During the third time 203, a new quantity of supercritical carbon dioxide can be fed into the processing chamber 108 and the other elements in the recirculation loop 115 from the high-pressure fluid supply system 140, and the supercritical corrosion inhibiting solution along with process residue suspended or dissolved therein can be displaced from the processing chamber 108 and the other elements in the recirculation loop 115 through the exhaust control system 160. In an alternate embodiment, supercritical carbon dioxide can be fed into the recirculation system 120 from the high-pressure fluid supply system 140, and the supercritical corrosion inhibiting solution along with process residue suspended or dissolved therein can be displaced from the processing chamber 108 and the other elements in the recirculation loop 115 through the exhaust control system 160.

In one embodiment, at least three decompression cycles can be used after a corrosion inhibiting process. In an alternate embodiment, one or more decompression cycles may be used after a corrosion inhibiting process.

In the illustrated embodiment shown in FIG. 2, a single second time 202 is followed by a single third time 203, but this is not required. In alternate embodiments, other time sequences may be used to process a substrate.

During a fourth time 204, a decompression process can be performed. In an alternate embodiment, a decompression process is not required. During the fourth time 204, the processing chamber 108 can be cycled through one or more decompression cycles and one or more compression cycles. The pressure can be cycled between a first pressure and a second pressure one or more times. In alternate embodiments, the first pressure and a second pressure can vary. For example, this can be accomplished by lowering the pressure to below approximately 2,500 psi and raising the pressure to above approximately 2,500 psi. In one embodiment, the pressure can be lowered by venting through the exhaust control system 160. The pressure can be increased by adding high-pressure carbon dioxide. In an alternate embodiment, during a portion of the fourth time 204, one or more additional pressures may be established.

Process steps corresponding to times 202, 203, and 204 can be repeated a number of times to achieve a desired process result, and a unique process recipe can be established for each different combination of the process steps. A process recipe can be used to establish the process parameters used during the different process recipes to deposit different corrosion-inhibiting materials. In addition, the process parameters can be different during the different process steps based on the type of corrosion inhibiting process being performed. For example, a process recipe established for depositing corrosion-inhibiting material on one type of substrate from one manufacturer line can be different from the process recipe established for depositing corrosion-inhibiting material on another type of substrate from a different manufacturer line. In addition, different recipes can be used for isolated and nested structures.

In one embodiment, a corrosion inhibiting process can be performed followed by at least three decompression cycles when processing a substrate with dielectric material thereon. In an alternate embodiment, one or more decompression cycles may be used after a corrosion inhibiting process.

During the fifth time 205, a cleaning process can be performed. In the illustrated embodiment, a single step cleaning process is shown, but this is not required. Alternately, a cleaning process may not be required or a multi-step cleaning process may be performed. In another embodiment, a variable pressure cleaning process may be performed. For example, this can be accomplished by lowering the pressure to below approximately 2,500 psi and raising the pressure to above approximately 2,500 psi. The pressure can be increased by adding high-pressure carbon dioxide.

In one embodiment, a cleaning pressure is established during the fifth time 205 using supercritical carbon dioxide. For example, the processing chamber can be pressurized to above approximately 2500 psi. In addition, a cleaning chemistry can be introduced into the processing chamber. Then, the cleaning chemistry can be recirculated within the processing chamber 108 for selected period of time to remove the remaining portions of the corrosion inhibiting chemistry and/or residue from a surface of the substrate. In one embodiment, the selected period of time is less than about three minutes. Alternately, the selected period of time may vary from approximately ten seconds to approximately ten minutes. Furthermore, additional cleaning chemistry and/or supercritical fluid may be provided.

In an alternate embodiment, the cleaning chemistry may be injected at a lower pressure; the pressure of the processing chamber can be increased; and the cleaning chemistry can be recirculated within the processing chamber for a period of time.

During a sixth time 206, a decompression process can be performed. In an alternate embodiment, a decompression process is not required. During the sixth time 206, the processing chamber 108 can be cycled through one or more decompression cycles and one or more compression cycles. The pressure can be cycled between a first pressure and a second pressure one or more times. In alternate embodiments, the first pressure and a second pressure can vary. For example, this can be accomplished by lowering the pressure to below approximately 2,500 psi and raising the pressure to above approximately 2,500 psi. In one embodiment, the pressure can be lowered by venting through the exhaust control system 160, and the pressure can be increased by adding supercritical carbon dioxide.

Process steps 205 and 206 can be repeated a number of times to achieve a desired process result, and different cleaning recipes can be established for each different combination of the process parameters. The recipe for a corrosion-inhibiting process can be used to establish the corrosion-inhibiting chemistry, the corrosion-inhibiting process time, and number of decompression cycles.

In one embodiment, the process chemistry used during one or more steps in the cleaning process used with a substrate having low-k and/or ultra-low-k material and exposed copper surfaces can be injected at a pressure above approximately 2200 psi and circulated at a pressure above approximately 2700 psi. In an alternate embodiment, the process chemistry used during one or more steps in the cleaning process used with a substrate having low-k and/or ultra-low-k material and exposed copper surfaces may be injected at a pressure above approximately 2500 psi and circulated at a pressure above approximately 2500 psi.

In one embodiment, processing a first type of substrate can require a first sequence of processes. For example, a first sequence of processes can include a first corrosion-inhibiting step followed by a first cleaning step, a second cleaning, and a third cleaning step. In addition, the corrosion-inhibiting chemistry can include benzotriazole (BTA) isopropyl alcohol (IPA) and supercritical carbon dioxide, and the cleaning chemistry can include 2-butanone peroxide and supercritical carbon dioxide.

Process steps 202, 203, 204, 205, and 206 can be repeated a number of times to achieve a desired process result for a particular material, and different combinations of corrosion-inhibiting recipes and cleaning recipes can be established for each different combination of the process parameters. A cleaning/rinsing recipe can be used to establish the cleaning/rinsing chemistry, cleaning/rinsing time, and number of decompression cycles.

During a seventh time 207, one or more additional processing steps can be performed. In an alternate embodiment, an additional processing step is not required. During the seventh time 207, a drying step, a rinsing step, a cleaning step, a push-through step, a pore sealing step, a dielectric repair step, or an etching step, or a combination thereof can be performed.

During an eighth time 208, one or more decompression cycles and one or more compression cycles can be performed as described above. In an alternate embodiment, additional decompression cycles and compression cycles may not be required.

During a ninth time 209, the processing chamber 108 can be returned to lower pressure. For example, after the decompression and compression cycles are complete, then the processing chamber can be vented or exhausted to a transfer system pressure. For substrate processing, the chamber pressure can be made substantially equal to the pressure inside of a transfer system (not shown) coupled to the processing chamber. In one embodiment, the substrate 105 can be moved from the processing chamber into the transfer, and moved to a second process apparatus or module to continue processing.

In the illustrated embodiment shown in FIG. 2, the pressure returns to an initial pressure $P_0$, but this is not required for the invention. In alternate embodiments, the pressure does not have to return to $P_0$, and the process sequence can continue with additional steps corresponding to the times 201, 202, 203, 204, 205, 206, 207, and/or 208.

The graph 200 is provided for exemplary purposes only. It will be understood by those skilled in the art that a supercritical process can have any number of steps having different time/pressures or temperature profiles without departing from the scope of the invention. Further, any number of cleaning and rinse processing sequences with each step having any number of compression and decompression cycles are contemplated. In addition, as stated previously, concentrations of various chemicals and species within a supercritical processing solution can be readily tailored for the application at hand and altered at any time within a supercritical processing step.

Figure 3:
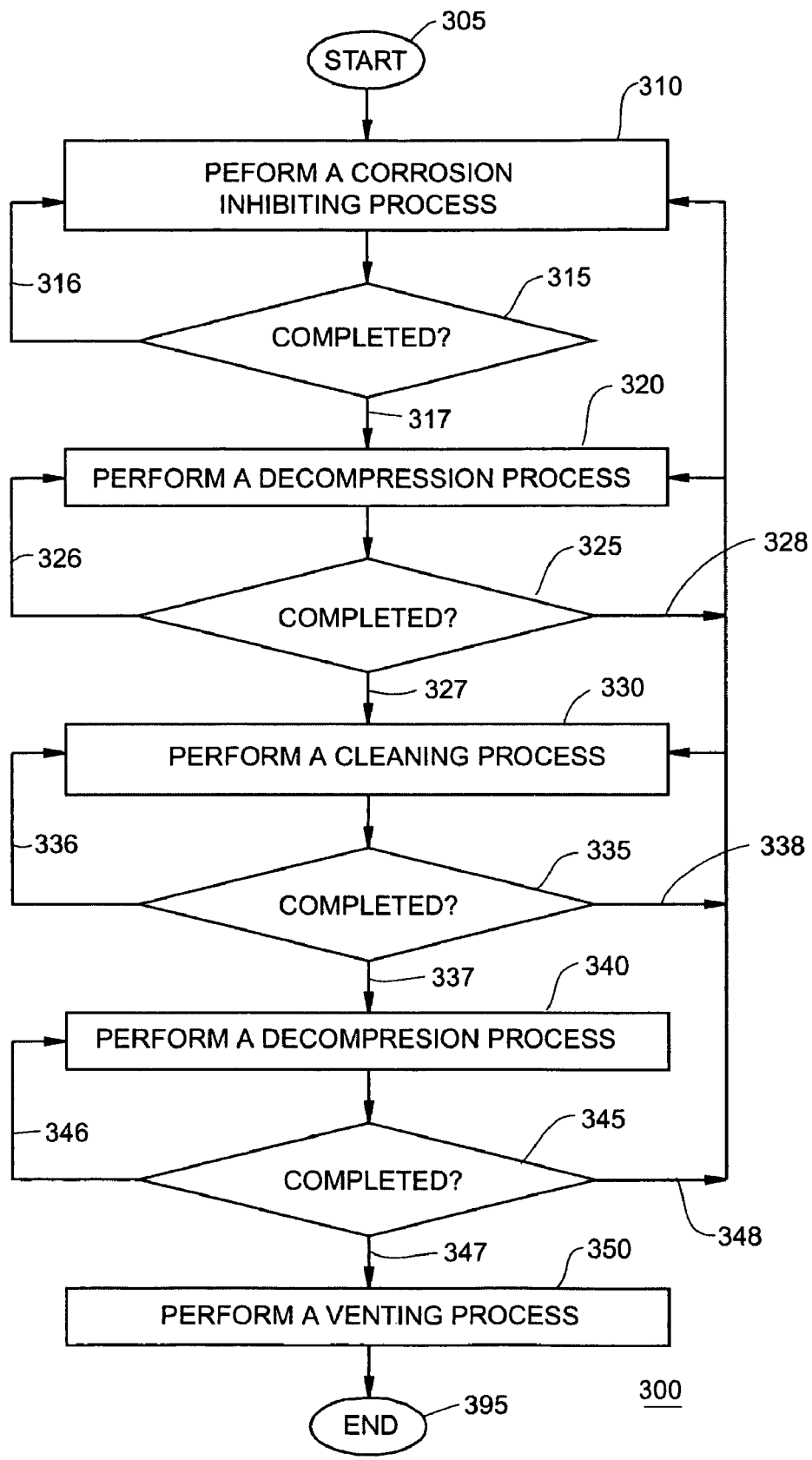
FIG. 3 illustrates a flow chart of a method of performing a corrosion inhibiting process on a substrate, in accordance with embodiments of the present invention.

FIG. 3 illustrates a flow chart of a method of performing a supercritical corrosion inhibiting process on a substrate in accordance with embodiments of the present invention. Procedure 300 can start at the step 305.

Referring to FIGS. 1-3, the substrate to be processed can be placed within the processing chamber 108 and the processing chamber 108 can be sealed. During a supercritical corrosion inhibiting process, the substrate 105 being processed can comprise semiconductor material, dielectric material, metallic material, photoresist material, and can have photoresist residue thereon. The substrate 105, the processing chamber 108, and the other elements in the recirculation loop 115 can be heated to an operational temperature. For example, the operational temperature can range from approximately 40 degrees Celsius to approximately 300 degrees Celsius. In some examples, the temperature can range from approximately 80 degrees Celsius to approximately 150 degrees Celsius.

In addition, the processing chamber 108 and the other elements in the recirculation loop 115 can be pressurized. For example, a supercritical fluid, such as substantially pure $CO_2$, can be used to pressurize the processing chamber 108 and the other elements in the recirculation loop 115. A pump (not shown), can be used to circulate the supercritical fluid through the processing chamber 108 and the other elements in the recirculation loop 115.

In 310, a corrosion inhibiting process can be performed. In one embodiment, a supercritical corrosion inhibiting process can be performed. Alternately, a non-supercritical corrosion inhibiting process can be performed. In one embodiment, a supercritical corrosion inhibiting process 310 can include recirculating the corrosion inhibiting chemistry within the processing chamber 108. Recirculating the corrosion inhibiting chemistry over the substrate 105 within the processing chamber 108 can comprise recirculating the corrosion inhibiting chemistry for a period of time to deposit one or more corrosion inhibiting materials onto the substrate.

In one embodiment, one or more push-through steps can be performed as a part of the corrosion inhibiting process. During a push-through step, a new quantity of supercritical carbon dioxide can be fed into the processing chamber 108 and the other elements in the recirculation loop 115 from the high-pressure fluid supply system 140, and the supercritical corrosion inhibiting solution along with the process byproducts suspended or dissolved therein can be displaced from the processing chamber 108 and the other elements in the recirculation loop 115 through the exhaust control system 160. In another embodiment, supercritical carbon dioxide can be fed into the recirculation system 120 from the high-pressure fluid supply system 140, and the supercritical corrosion inhibiting solution along with process byproducts suspended or dissolved therein can also be displaced from the processing chamber 108 and the other elements in the recirculation loop 115 through the exhaust control system 160. In an alternate embodiment, a push-through step is not required during a cleaning step.

In one embodiment, dielectric material can be processed and one or more corrosion inhibiting materials can be applied to the patterned dielectric material on the substrate using process chemistry that includes one or more inhibitors, such as BTA, and one or more solvents, such as IPA.

In 315, a query is performed to determine when the corrosion inhibiting process has been completed. When the corrosion inhibiting process is completed, procedure 300 can branch 317 to 320 and continues. When the corrosion inhibiting process is not completed, procedure 300 branches back 316 to 310 and the corrosion inhibiting process continues. One or more extraction steps can be performed during a corrosion inhibiting process. For example, different chemistries, different concentrations, different process conditions, and/or different times can be used in different corrosion inhibiting process steps.

In 320, a decompression process can be performed while maintaining the processing system in a supercritical state. In one embodiment, a two-pressure process can be performed in which the two pressures are above the critical pressure. Alternately, a multi-pressure process can be performed. In another embodiment, a decompression process is not required. During a decompression process, the processing chamber 108 can be cycled through one or more decompression cycles and one or more compression cycles. The pressure can be cycled between a first pressure and a second pressure one or more times. In alternate embodiments, the first pressure and/or a second pressure can vary. In one embodiment, the pressure can be lowered by venting through the exhaust control system 160. For example, this can be accomplished by lowering the pressure to below approximately 2,500 psi and raising the pressure to above approximately 2,500 psi. The pressure can be increased by adding high-pressure carbon dioxide.

In 325, a query is performed to determine when the decompression process 320 has been completed. When the decompression process is completed, procedure 300 can branch 327 to 330, and procedure 300 can continue on to step 330 if no additional corrosion inhibiting steps are required. When the decompression process is completed and additional corrosion-inhibiting steps are required, procedure 300 can branch 328 back to 310, and procedure 300 can continue by performing additional corrosion inhibiting steps as required.

When the decompression process is not completed, procedure 300 can branch back 326 to 320 and the decompression process continues. One or more pressure cycles can be performed during a decompression process. For example, different chemistries, different concentrations, different process conditions, and/or different times can be used in different pressure steps.

In one embodiment, three to six decompression and compression cycles can be performed after the corrosion inhibiting process is performed.

In 330, a cleaning process can be performed. In one embodiment, a single pressure cleaning process can be performed. Alternately, a multi-pressure cleaning process can be performed. In another embodiment, a variable pressure cleaning process can be performed. In one embodiment, the method of performing a cleaning process 330 can comprise the step of pressurizing the processing chamber 108 with gaseous, liquid, supercritical, or near-supercritical carbon dioxide. For example, the processing chamber can be pressurized to above approximately 2200 psi. Next, a cleaning chemistry can be introduced into the processing chamber. In the next step, the pressure of the processing chamber can be increased. Then, the cleaning chemistry can be recirculated within the processing chamber for a first period of time to remove by-products of the corrosion inhibiting process from the process chamber and from one or more surfaces of the substrate. It should be appreciated that "remove by-products" can also encompass removing post-etch and/or post-ash residue. In one embodiment, the first period of time is less than about three minutes. Alternately, the first period of time may vary from approximately ten seconds to approximately ten minutes.

In an alternate embodiment, one or more push-through steps (not shown) can be performed as a part of the cleaning process. During a push-through step, a new quantity of supercritical carbon dioxide can be fed into the processing chamber 108 and the other elements in the recirculation loop 115 from the high-pressure fluid supply system 140, and the supercritical cleaning solution along with process residue suspended or dissolved therein can be displaced from the processing chamber 108 and the other elements in the recirculation loop 115 through the exhaust control system 160. In another embodiment, supercritical carbon dioxide can be fed into the recirculation system 120 from the high-pressure fluid supply system 140, and the supercritical cleaning solution along with process residue suspended or dissolved therein can also be displaced from the processing chamber 108 and the other elements in the recirculation loop 115 through the exhaust control system 160.

In 335, a query is performed to determine when the cleaning process 330 has been completed. When the cleaning process is completed, procedure 300 can branch 337 to 340, and procedure 300 can continue on to step 340 if no additional corrosion inhibiting steps are required. When the cleaning process is completed and additional corrosion-inhibiting steps are required, procedure 300 can branch 338 back to 310, and procedure 300 can continue by performing corrosion inhibiting steps as required.

When the cleaning process is not completed, procedure 300 can branch back 336 to 330 and the cleaning process can continue. One or more cleaning cycles can be performed during a cleaning process. For example, different chemistries, different concentrations, different process conditions, and/or different times can be used in different pressure steps.

In 340, a decompression process can be performed. In one embodiment, a two-pressure process can be performed. Alternately, a multi-pressure process can be performed. In another embodiment, decompression process 340 is not required. During a decompression process, the processing chamber 108 can be cycled through one or more decompression cycles and one or more compression cycles. The pressure can be cycled between a first pressure and a second pressure one or more times. In alternate embodiments, the first pressure and/or a second pressure can vary. In one embodiment, the pressure can be lowered by venting through the exhaust control system 160. For example, this can be accomplished by lowering the pressure to below approximately 2,500 psi and raising the pressure to above approximately 2,500 psi. The pressure can be increased by adding high-pressure carbon dioxide.

In 345, a query is performed to determine when the decompression process 340 has been completed. When the decompression process 340 is completed, procedure 300 can branch 347 to 350, and procedure 300 can continue on to step 350 if no additional corrosion inhibiting steps are required.

When the decompression process 340 is completed and additional corrosion-inhibiting steps are required, procedure 300 can branch 328 back to 310, and procedure 300 can continue by performing an additional corrosion inhibiting steps as required. In one embodiment, substantially the same corrosion inhibiting process recipe can be performed one or more times. For example, a process chemistry comprising BTA and IPA can be used one or more steps in a corrosion-inhibiting process for vias and trenches having dimensions ranging from approximately 0.01 micron to approximately 2.0 micron.

When the decompression process 340 is completed and additional cleaning is required, procedure 300 can branch 348 back to 330, and procedure 300 can continue by performing an additional cleaning process. In one embodiment, substantially the same cleaning process recipe can be performed one or more times.

When the decompression process is not completed, procedure 300 branches back 346 to 340 and the decompression process continues. One or more pressure cycles can be performed during a decompression process. For example, different chemistries, different concentrations, different process conditions, and/or different times can be used in different pressure steps.

In 350, a venting process can be performed. In one embodiment, a variable pressure venting process can be performed. Alternately, a multi-pressure venting process can be performed. During a venting process, the pressure in the processing chamber 108 can be lower to a pressure that is compatible with a transfer system pressure. In one embodiment, the pressure can be lowered by venting through the exhaust control system 160.

Procedure 300 ends in 395.

Figure 4:
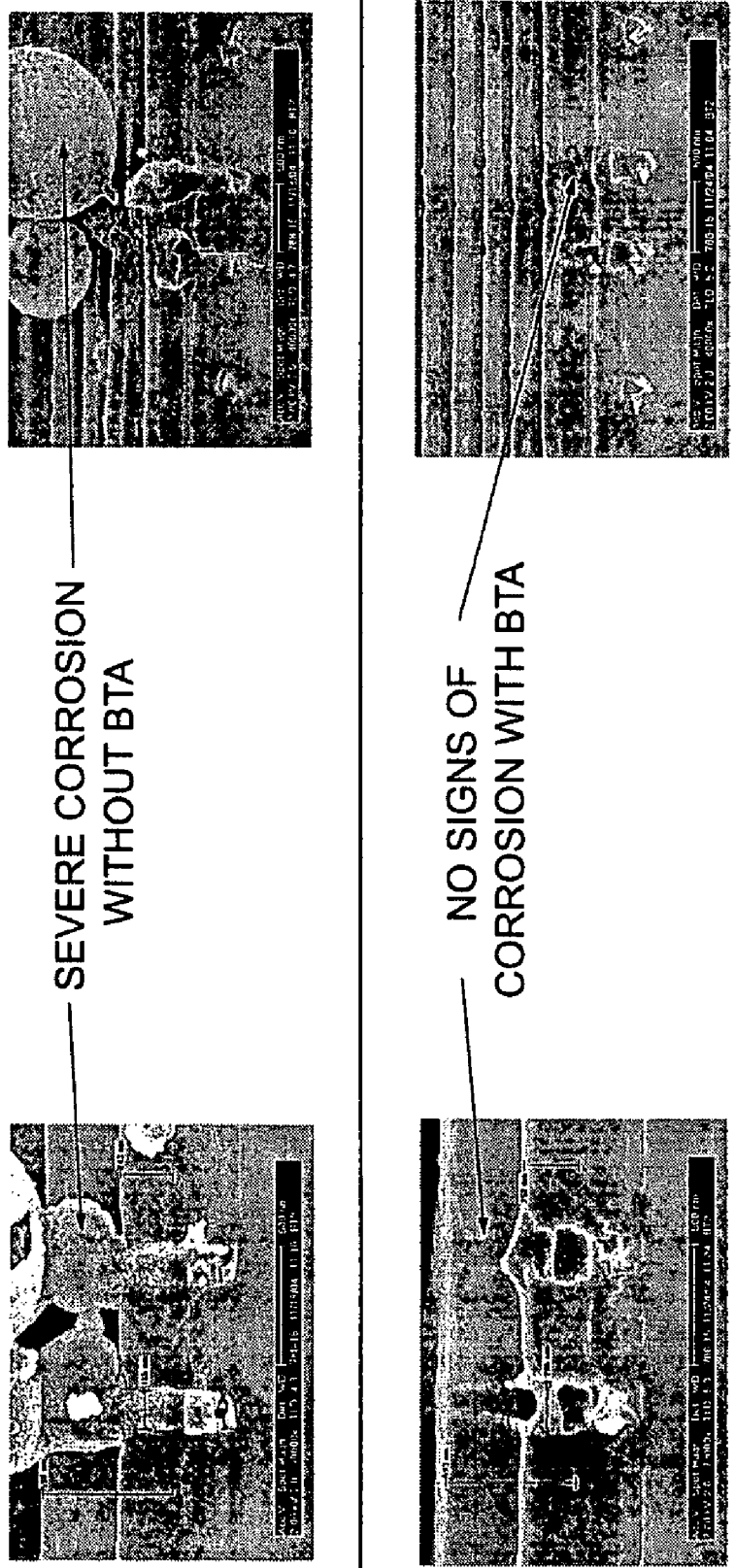
FIG. 4 illustrates exemplary results for processes performed, in accordance with an embodiment of the invention.

FIG. 4 illustrates exemplary results for processes performed in accordance with an embodiment of the invention. Scanning Electron Microscopy (SEM) images are shown for an embodiment using BTA. The top images show extensive oxidation or corrosion of exposed metal surfaces of a patterned wafer substrate resulting from a supercritical carbon dioxide cleaning step. The lower images show greatly reduced oxidation or corrosion on the exposed metal surfaces of the patterned wafer that has been pretreated prior to the supercritical cleaning process, in accordance with the embodiments of the invention.

While the invention has been described in terms of specific embodiments incorporating details to facilitate the understanding of the principles of construction and operation of the invention, such reference herein to specific embodiments and details thereof is not intended to limit the scope of the claims appended hereto. It will be apparent to those skilled in the art that modifications may be made in the embodiments chosen for illustration without departing from the spirit and scope of the invention.

What is claimed is:

1. A method of processing a semiconductor substrate having a patterned layer with exposed metal thereon, the method comprising the steps of:
   a) positioning the substrate on a substrate holder in a processing chamber;
   b) performing a corrosion inhibiting process using a first supercritical fluid limited to supercritical CO2 and corrosion inhibiting chemistry, the corrosion inhibiting chemistry comprising at least one of a nitrogen-based inhibitor and a sulfur-based inhibitor; and
   c) performing a cleaning process using a second supercritical fluid limited to supercritical CO2 and cleaning chemistry after the step performing the corrosion inhibiting process.

2. The method of claim 1, wherein the semiconductor substrate further comprises one or more of a semiconductor material, metallic material, dielectric material and a ceramic material, or a combination of two or more thereof.

3. The method of claim 2, wherein the semiconductor substrate comprises a low-k material, or an ultra low-k material, or a combination thereof.

4. The method of claim 2, wherein the exposed metal comprises copper (Cu), tantalum (Ta), cobalt (Co), or a combination thereof.

5. The method of claim 1, wherein the corrosion inhibiting chemistry comprises an inhibitor and a co-solvent.

6. The method of claim 5, wherein the inhibitor comprises 2-aminopyrimidine (AP), 2-amino-5-mercapto-1,3,4-thiadiazole (AMT), benzotriazole (BTA), 5,6-dimethylbenzimidazole (DB), 2-mercaptobenzimidazole (MBI), 2-mercaptobenzoxazole (MBO), 2-mercaptopyrimidine (MP) and 2-mercaptobenzothiazole (MBT).

7. The method of claim 5, wherein the co-solvent comprises an alcohol.

8. The method of claim 7, wherein the alcohol comprises isopropyl alcohol (IPA).

9. The method of claim 1, wherein the cleaning chemistry comprises a peroxide.

10. The method of claim 9, wherein the cleaning chemistry comprises 2-butanone peroxide.

11. The method of claim 1, wherein the cleaning chemistry comprises an acid and a co-solvent.

12. The method of claim 1, wherein the step of performing a corrosion inhibiting process comprises:
   pressurizing the processing chamber to a first pressure;
   introducing the first supercritical fluid into the processing chamber;
   changing the processing chamber pressure to a second pressure; and
   recirculating the first supercritical fluid within the processing chamber for a first period of time.

13. The method of claim 12, wherein the second pressure is equal to or greater than the first pressure.

14. The method of claim 13, wherein the first pressure is below approximately 2700 psi and the second pressure is above approximately 2700 psi.

15. The method of claim 12, wherein the second pressure is less than the first pressure.

16. The method of claim 12, wherein the first period of time is in a range of thirty seconds to ten minutes.

17. The method of claim 12, wherein the step of performing a corrosion inhibiting process further comprises performing a series of decompression cycles.

18. The method of claim 17, wherein the step of performing a series of decompression cycles comprises performing one-to-six decompression cycles.

19. The method of claim 12, wherein the step of performing a corrosion inhibiting process further comprises performing a push-through process wherein the processing chamber is pressurized to an elevated pressure and vented to push the corrosion inhibiting chemistry out of the processing chamber after recirculating the corrosion inhibiting chemistry.

20. The method of claim 19, wherein the elevated pressure is above approximately 3000 psi.

21. The method of claim 1, wherein the step of performing a cleaning process comprises the steps of:
pressurizing the processing chamber to a third pressure;
introducing the second supercritical fluid into the processing chamber; and
recirculating the second supercritical fluid within the processing chamber for a second period of time.

22. The method of claim 21, wherein the second period of time is in a range of thirty seconds to ten minutes.

23. The method of claim 21, wherein the step of performing a cleaning process further comprises performing a series of decompression cycles.

24. The method of claim 23, wherein the step of performing a series of decompression cycles comprises performing one-to-six decompression cycles.

25. The method of claim 21, wherein the step of step of performing a cleaning process further comprises performing a push-through process wherein the processing chamber is pressurized to an elevated pressure to push the cleaning chemistry out of the processing chamber after recirculating the cleaning chemistry within the processing chamber.

26. The method of claim 25, wherein the elevated pressure is above approximately 3000 psi.

27. The method of claim 1, further comprising:
pressurizing the processing chamber to a first cleaning pressure;
introducing a cleaning chemistry into the processing chamber; and
recirculating the cleaning chemistry within the processing chamber.

28. The method of claim 27, further comprises performing a series of decompression cycles after recirculating the cleaning chemistry.

29. The method of claim 27, further comprises performing a push-through process wherein the processing chamber is pressurized to an elevated pressure to push the cleaning chemistry out of the processing chamber after recirculating the cleaning chemistry.

30. The method of claim 29, further comprises performing a series of decompression cycles after performing a push-through process.

31. The method of claim 1, further comprising the step of performing an additional process after performing the cleaning process.

32. The method of claim 31, wherein the additional process comprises a drying step, a rinsing step, a cleaning step, a push-through step, a decompression cycle, a pore sealing step, a dielectric repair step, or an etching step, or a combination of two or more thereof.

33. The method of claim 1 further comprising the step of venting the processing chamber the corrosion inhibiting process and the cleaning process.

* * * * *